(12) United States Patent
Lakshmanan et al.

(10) Patent No.: US 10,784,157 B2
(45) Date of Patent: Sep. 22, 2020

(54) DOPED TANTALUM NITRIDE FOR COPPER BARRIER APPLICATIONS

(71) Applicant: Applied Materials, Inc., Santa Clara, CA (US)

(72) Inventors: Annamalai Lakshmanan, Fremont, CA (US); Paul F. Ma, Santa Clara, CA (US); Mei Chang, Saratoga, CA (US); Jennifer Shan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/689,871

(22) Filed: Nov. 30, 2012

(65) Prior Publication Data

US 2013/0140698 A1    Jun. 6, 2013

Related U.S. Application Data

(60) Provisional application No. 61/565,641, filed on Dec. 1, 2011.

(51) Int. Cl.
*H01L 21/768* (2006.01)
*H01L 23/538* (2006.01)
(Continued)

(52) U.S. Cl.
CPC .. *H01L 21/76843* (2013.01); *H01L 21/28562* (2013.01); *H01L 21/76846* (2013.01); *H01L 21/76862* (2013.01); *H01L 21/76864* (2013.01); *H01L 23/5384* (2013.01); *H01L 23/53238* (2013.01); *H01L 21/76831* (2013.01); *H01L 2924/0002* (2013.01)

(58) Field of Classification Search
CPC .......... H01L 23/5384; H01L 21/76843; H01L 23/538; H01L 21/768; H01L 2924/0002
See application file for complete search history.

(56) References Cited

U.S. PATENT DOCUMENTS 5,976,928 A * 11/1999 Kirlin ..................... H01L 28/55
257/E21.009
6,294,836 B1 * 9/2001 Paranjpe ............. H01L 21/2855
257/758
(Continued)

FOREIGN PATENT DOCUMENTS

CN         101558476 A    10/2009
KR    10-2006-0089219       8/2006
(Continued)

OTHER PUBLICATIONS

PCT International Search Report and Written Opinion in PCT/US2012/067212, dated Mar. 26, 2013, 12 pgs.
(Continued)

*Primary Examiner* — Kenneth Parker
*Assistant Examiner* — Long H Le
(74) *Attorney, Agent, or Firm* — Servilla Whitney LLC (57) ABSTRACT

Described are doped TaN films, as well as methods for providing the doped TaN films. Doping TaN films with Ru, Cu, Co, Mn, Al, Mg, Cr, Nb, Ti and/or V allows for enhanced copper barrier properties of the TaN films. Also described are methods of providing films with a first layer comprising doped TaN and a second layer comprising one or more of Ru and Co, with optional doping of the second layer.

22 Claims, 4 Drawing Sheets

(51) Int. Cl.
*H01L 21/285* (2006.01)
*H01L 23/532* (2006.01)

(56) References Cited

U.S. PATENT DOCUMENTS

| | | | | |
|---|---|---|---|---|
| 6,365,502 | B1* | 4/2002 | Paranjpe et al. | 438/622 |
| 7,157,795 | B1 | 1/2007 | Erb et al. | |
| 7,808,106 | B1* | 10/2010 | Eisenbraun | C23C 16/06 |
| | | | | 257/751 |
| 8,013,445 | B2 | 9/2011 | Lee et al. | |
| 2002/0137332 | A1* | 9/2002 | Paranjpe | H01L 21/28556 |
| | | | | 438/637 |
| 2004/0188850 | A1 | 9/2004 | Lee et al. | |
| 2005/0070109 | A1 | 3/2005 | Feller et al. | |
| 2005/0161817 | A1 | 7/2005 | Meyer et al. | |
| 2006/0267205 | A1 | 11/2006 | Koerner | |
| 2008/0142971 | A1 | 6/2008 | Dordi et al. | |
| 2008/0179747 | A1* | 7/2008 | Sakai | H01L 21/76805 |
| | | | | 257/751 |
| 2009/0152722 | A1* | 6/2009 | Chang | H01L 21/76886 |
| | | | | 257/742 |
| 2009/0209101 | A1* | 8/2009 | Shinriki | C23C 16/32 |
| | | | | 438/686 |
| 2009/0218693 | A1* | 9/2009 | Lee | H01L 21/76843 |
| | | | | 257/751 |
| 2009/0289365 | A1 | 11/2009 | Yang et al. | |
| 2009/0297696 | A1* | 12/2009 | Pore | C23C 16/405 |
| | | | | 427/79 |
| 2010/0009530 | A1* | 1/2010 | Haneda | H01L 21/2855 |
| | | | | 438/627 |
| 2010/0013096 | A1* | 1/2010 | Irumata | C23C 14/3414 |
| | | | | 257/741 |
| 2010/0081274 | A1 | 4/2010 | Ishizaka et al. | |
| 2010/0200991 | A1* | 8/2010 | Akolkar | H01L 21/28562 |
| | | | | 257/751 |
| 2011/0306203 | A1* | 12/2011 | Dordi | H01L 21/76846 |
| | | | | 438/653 |
| 2013/0081687 | A1* | 4/2013 | Wu et al. | 136/256 |

FOREIGN PATENT DOCUMENTS

| | | |
|---|---|---|
| KR | 1020090094369 A | 9/2009 |
| KR | 10-2011-0014586 | 2/2011 |
| TW | 201027625 A1 | 7/2010 |

OTHER PUBLICATIONS

PCT International Preliminary Report on Patentability in PCT/US2012/067212, dated Jun. 12, 2014, 8 pages.

Casey, P. et al., "Chemical and structural investigation of the role of both Mn and Mn oxide in the formation of manganese silicate barrier layers on $SiO_2$", *Journal of Applied Physics 110* 2011, 6 pgs.

* cited by examiner

DOPED TANTALUM NITRIDE FOR COPPER BARRIER APPLICATIONS

CROSS-REFERENCE TO RELATED APPLICATIONS

This application claims the benefit under 35 U.S.C. § 119(e) to U.S. Provisional Application No. 61/565,641, filed Dec. 1, 2011, the entire content of which is incorporated herein by reference in its entirety

FIELD

The present invention relates generally to barrier layers in semiconductor devices, and methods of forming such barrier layers. More particularly, the disclosed method relates to films comprising TaN and selected dopants.

BACKGROUND

Microelectronic devices, such as semiconductors or integrated circuits, can include millions of electronic circuit devices such as transistors, capacitors, etc. To further increase the density of devices found on integrated circuits, even smaller feature sizes are desired. To achieve these smaller feature sizes, the size of conductive lines, vias, and interconnects, gates, etc. must be reduced. Reliable formation of multilevel interconnect structures is also necessary to increase circuit density and quality. Advances in fabrication techniques have enabled use of copper for conductive lines, interconnects, vias, and other structures. However, electromigration in interconnect structures becomes a greater hurdle to overcome, with decreased feature size and the increased use of copper for interconnections.

Tantalum nitride (TaN) is a copper barrier at film thicknesses greater than 10 A, where the film is continuous. However, because a Ta atom is about 4 A in diameter, TaN films around 5 A thick are not continuous. For smaller nodes where thinner TaN is required, TaN by itself may be a discontinuous film, thus limiting its copper barrier properties. Current methods include a Ta layer on top of a TaN layer, which acts as a wetting layer for copper and provides the continuity of a barrier film. For smaller nodes (less than 32 nm), however, this method leads to larger line resistance and hence is not an adequate solution.

Therefore, there is a need for thin layers that are effective copper barriers.

SUMMARY OF THE INVENTION

One aspect of the current invention pertains to a method for forming interconnections in a microelectronic device comprising: providing a substrate comprising a dielectric layer disposed thereon, the dielectric layer having one or more trenches and/or vias with an opening, a sidewall and a bottom; depositing a barrier layer comprising TaN and one or more dopants on at least a portion of the sidewall and/or bottom of the trench and/or via to provide a lined trench and/or via; and depositing a conductive material comprising Cu into the lined trench and/or via. According to one or more embodiments of this aspect, the one or more dopants are selected from Ru, Cu, Cu, Mn, Al, Mg, Cr, Nb, Ti and V. In some embodiments, the dopant comprises Mn. In other embodiments, the dopant comprises one or more of Ru, Cu and Co. According to one or more embodiments, the conductive material further comprises Mn.

One or more embodiments provide that depositing the barrier layer comprises depositing alternating layers comprising TaN and dopant. In other embodiments, depositing the barrier layer comprises depositing a TaN layer and diffusing the dopant into the TaN layer.

In one or more embodiments, the method further comprises exposing the barrier layer to plasma treatment prior to depositing the conductive material comprising Cu. In certain embodiments, the plasma comprises one or more of He, Ar, $NH_3$, $H_2$ and $N_2$.

Another aspect of the invention pertains to a method for forming interconnections in a microelectronic device comprising: providing a substrate comprising a dielectric layer disposed thereon, the dielectric layer having one or more trenches and/or vias with an opening, a sidewall and a bottom; depositing a first layer comprising TaN and one or more first dopants on at least a portion of the sidewall and/or bottom of the trench and/or via to provide a lined trench and/or via; depositing a second layer comprising one or more of Ru and Co upon the first layer; and depositing a conductive material comprising Cu into the lined trench and/or via.

According to one or more embodiments of this aspect, the one or more first dopants are selected from Ru, Cu, Co, Mn, Al, Mg, Cr, Nb, Ti and V. In some embodiments, the first dopant comprises Mn. In other embodiments, the first dopant comprises one or more of Ru, Cu and Co. According to one or more embodiments, the conductive material further comprises Mn. One or more embodiments provide that the second layer further comprises one or more second dopants selected from Mn, Al, Mg, Cr, Nb, Ti and V.

In one or more embodiments, the first layer is deposited by depositing alternating layers comprising TaN and the first dopant. In certain embodiments, the second layer is deposited by depositing alternating layers comprising Ru or Co and the second dopant.

According to one or more embodiments, the method of this aspect further comprises exposing the first layer and/or the second layer to plasma treatment prior to depositing the conductive material. In certain embodiments, the plasma comprises one or more of He, Ar, $NH_3$, $H_2$ and $N_2$.

Yet another aspect of the invention provides a microelectronic device comprising: a substrate comprising a dielectric layer disposed thereon, the dielectric layer having one or more trenches and/or vias with an opening, a sidewall and a bottom; a first layer lining at least a portion of the sidewall and/or bottom of the trench and/or via, the first layer comprising TaN and one or more dopants selected from Ru, Cu, Co, Mn, Al, Mg, Cr, Nb, Ti and V; a second layer comprising one or more of Ru and Co overlying the first layer; and a conductive material comprising Cu filling the lined trench and/or via. According to one or more embodiments, the first layer has a thickness less than 10 Angstroms.

In one or more embodiments of this aspect, the conductive material further comprises Mn. In certain embodiments, the conductive material comprises less than wt. 2% Mn.

One or more embodiments of this aspect provide that the second layer further comprises one or more dopants selected from Mn, Al, Mg, Cr, Nb, Ti and V.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways. Although specific reference is made to trenches in the following description, it is to be understood that the processes, films and devices described herein may involve similar structures such as vias, through-silicon-vias (TSVs), dual damascene structures and the like.

Figure 1A:
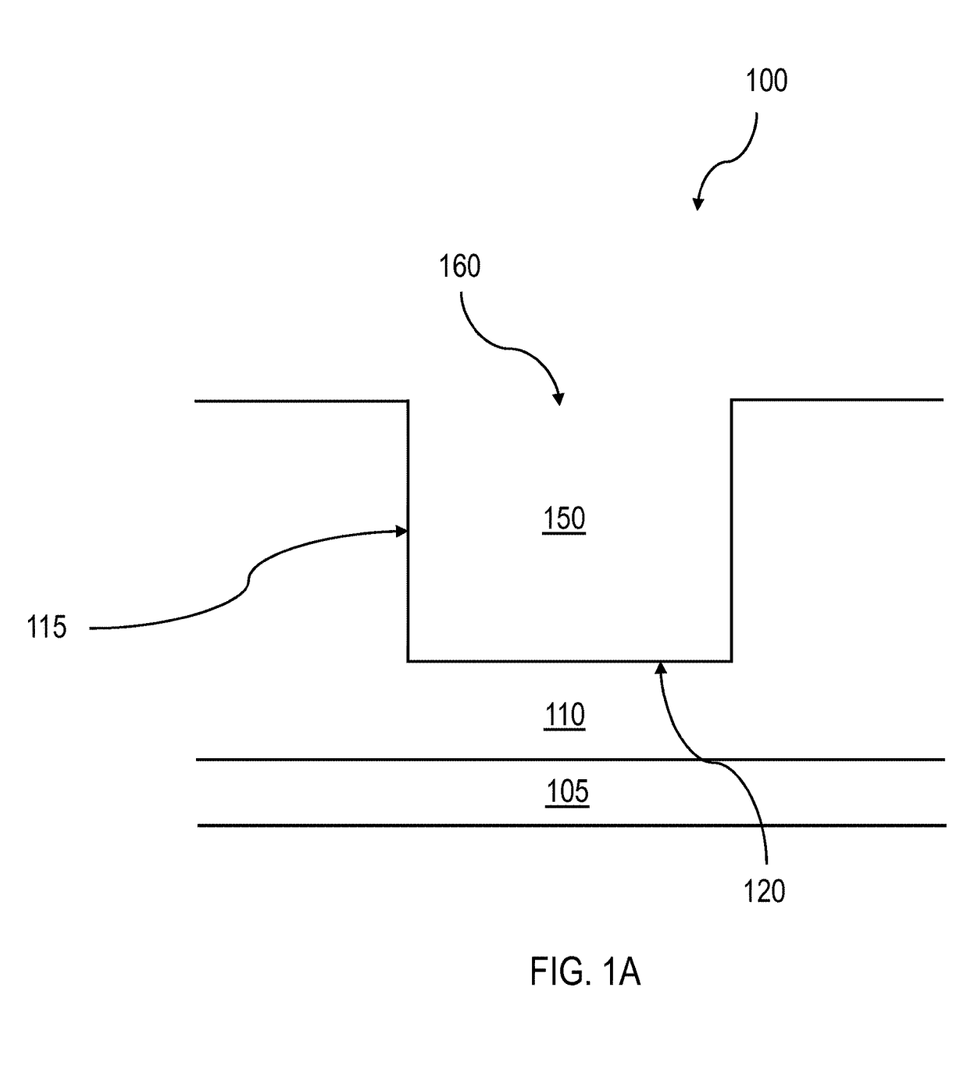
FIGS. 1A and 1B illustrate a dielectric layer before and after deposition of a barrier layer and conductive fill material in accordance with one or more embodiments of the invention.

One aspect of the invention relates to a microelectronic device comprising a substrate, a dielectric layer, a barrier layer, and a conductive material. FIG. 1A depicts an embodiment of a microelectronic device 100 comprising a substrate 105 and a dielectric layer 110. The dielectric layer 110 is disposed upon the substrate 105, and the dielectric layer 110 has a trench 150 defined by a trench bottom 120, sidewalls 115, and opening 160.

In one or more embodiments, the dielectric layer 110 is a low-k dielectric layer. In certain embodiments, the dielectric layer comprises $SiO_x$. Further embodiments provide that the dielectric layer comprises porous carbon-doped $SiO_x$. In some embodiments, the dielectric layer is a porous carbon-doped $SiO_x$ layer with a k value less than 3.

Figure 1B:
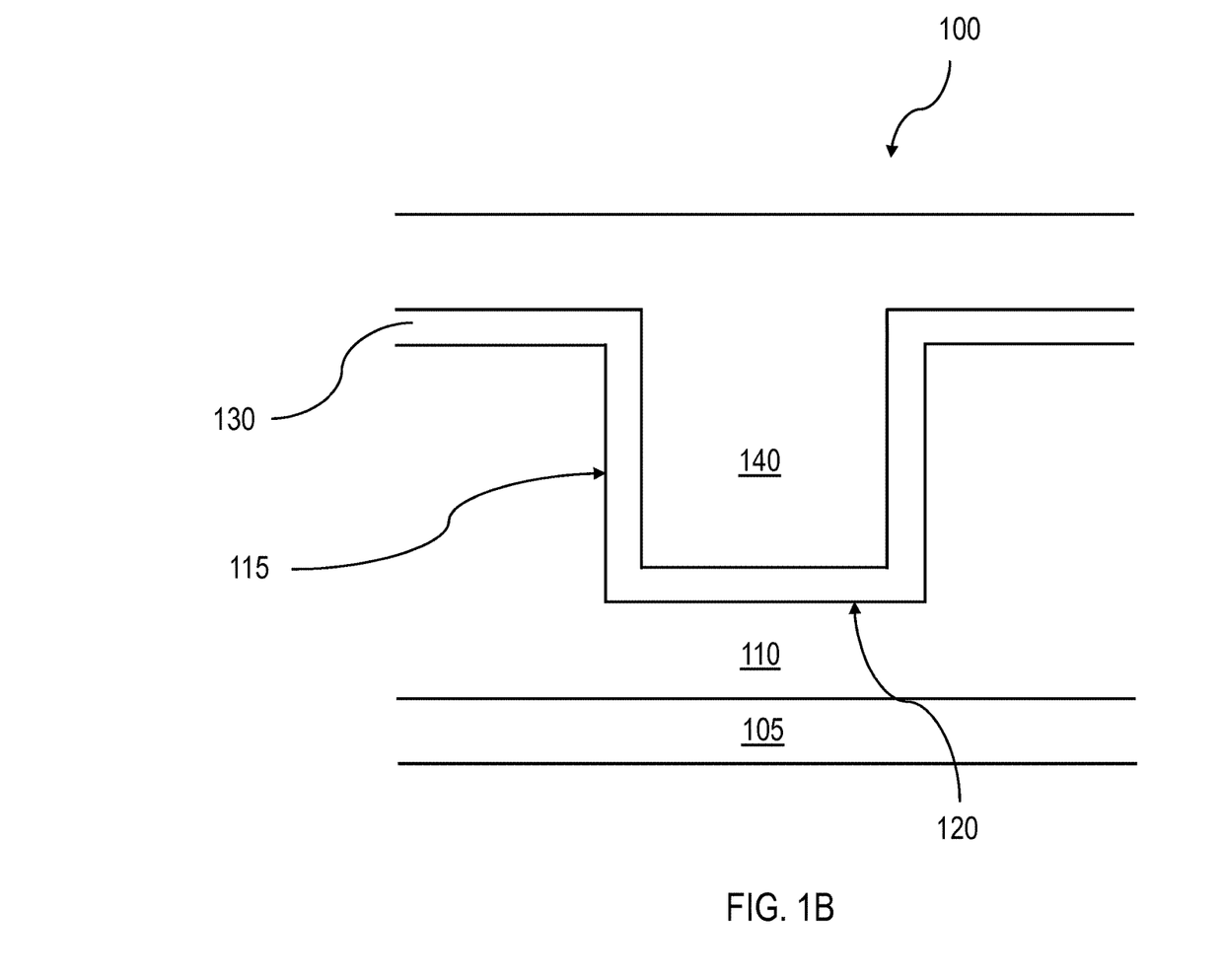

FIG. 1B shows the same microelectronic device 100 after deposition of a barrier layer 130, which covers at least a portion of the sidewall 115 and/or trench bottom 120. As shown in FIG. 1B, the barrier layer 130 may cover the entirety of the sidewall 115 and trench bottom 120. The barrier layer 130 may comprise TaN and one or more dopants such as Ru, Cu, Co, Mn, Al, Mg, Cr, Nb, Ti or V. According to one or more embodiments, the barrier layer comprises TaN and Mn. In other embodiments, the barrier layer comprises TaN and one or more of Ru, Cu and Co.

In one or more embodiments, the barrier layer comprises 0.1 to 10% dopant, based on the weight of the TaN layer. In certain embodiments, the barrier layer comprises 0.2 to 8 wt. % dopant. In some embodiments, the barrier layer comprises 0.5 to 5 wt. % dopant, such as about 0.5, about 1, about 1.5, about 2, about 2.5, about 3, about 3.5, about 4, about 4.5, or about 5 wt. % dopant.

According to one or more embodiments, as used herein, "barrier layer" refers to a discrete layer formed by depositing TaN and one or more dopants, and excludes a region in which a second element or dopant diffuses into only a portion of the barrier layer. In other words, some embodiments provide that the dopant is present throughout the entire thickness of the TaN layer, and not only at a surface portion thereof.

A conductive fill material 140 fills at least a portion of the trench 150 lined with barrier layer 130. According to one or more embodiments, the conductive fill material comprises copper or a copper alloy. In further embodiments, the conductive fill material also comprises Mn. In other embodiments, the conductive fill material further comprises Al.

Although the conductive fill material 140 in FIG. 1B is shown in direct contact with the barrier layer 130, intermediate layers may be in between the conductive fill material 140 and the barrier layer 130, such as adhesion layers or seeding layers. According to one or more embodiments, the microelectronic device further comprises an adhesion layer comprising one or more of Ru and Co. In addition to Ru and/or Co, the adhesion layer may comprise one or more dopants such as Mn, Al, Mg, Cr, Nb, Ti or V. In some embodiments, the adhesion layer comprises Ru and Mn. In other embodiments, the adhesion layer comprises Co and Mn.

In certain embodiments, a seeding layer is deposited on top of the barrier layer. According to one or more embodiments, the seeding layer comprises an alloy of copper, such as a Cu—Mn alloy. In certain embodiments, the seeding layer comprises less than 2 wt. % Mn. In some embodiments, the seeding layer comprises about 1 wt. % Mn. The line resistance of copper alloys containing 1 wt. % Mn is expected to be the same as or similar to the line resistance of pure copper.

While not wishing to be bound to any particular theory, it is thought that the dopant can selectively diffuse through the barrier layer 130 to the dielectric layer 110 and form a complex with the dielectric material that will be resistant to electromigration. Thus, in embodiments where the dopant is Mn and the dielectric layer comprises $SiO_x$, the Mn can diffuse through the barrier layer and form $MnSiO_x$. This self-forming barrier layer of $MnSiO_x$ can then prevent copper electromigration from the conductive material 140 to the dielectric layer 110.

When the barrier layer is greater than 10 Å, such as 25 Å, undoped TaN is effective as a copper barrier layer. However, TaN layers of this thickness are often too thick for use in smaller nodes, such as those less than 32 nm.

Depending on the dopant used, the penetration depth of the dopant may be less than 10 Å. Thus, for TaN layers of about 10 Å, the dopant may not penetrate to the dielectric layer to form the dopant-dielectric complex. However, the copper penetration depth may be more than 10 Å, thus rendering the barrier layer ineffective. Accordingly, one or more embodiments of the present invention provide that the TaN layer is less than 10 Å. In certain embodiments, the TaN layer is in the range of 4 Å to 10 Å.

In addition to being a copper barrier, doped TaN may also be a barrier to oxygen diffusing from the dielectric layer 110 to the conductive material 140. Oxygen diffusion from the dielectric layer 110 to the conductive material 140 can result in oxygen reacting with components in the conductive material and/or seed layer. For example, if the conductive material 140 comprises Mn, then oxygen can react with the Mn at the interface of the barrier layer 130 and the conductive material 140, thus "pinning" the Mn to the barrier layer/conductive material interface. As a result, the Mn cannot segregate throughout the conductive material. Similarly, if a seed layer comprising Mn is present, then oxygen can react with the Mn in the seed layer at the seed layer/barrier layer interface and pin the Mn to the interface.

It is believed that oxygen diffusing into the TaN layer will react with the dopant and will prevent oxygen from diffusing into the conductive material 140. As a result, oxygen will not be available to react with the seed layer or the conductive material.

Figure 2:
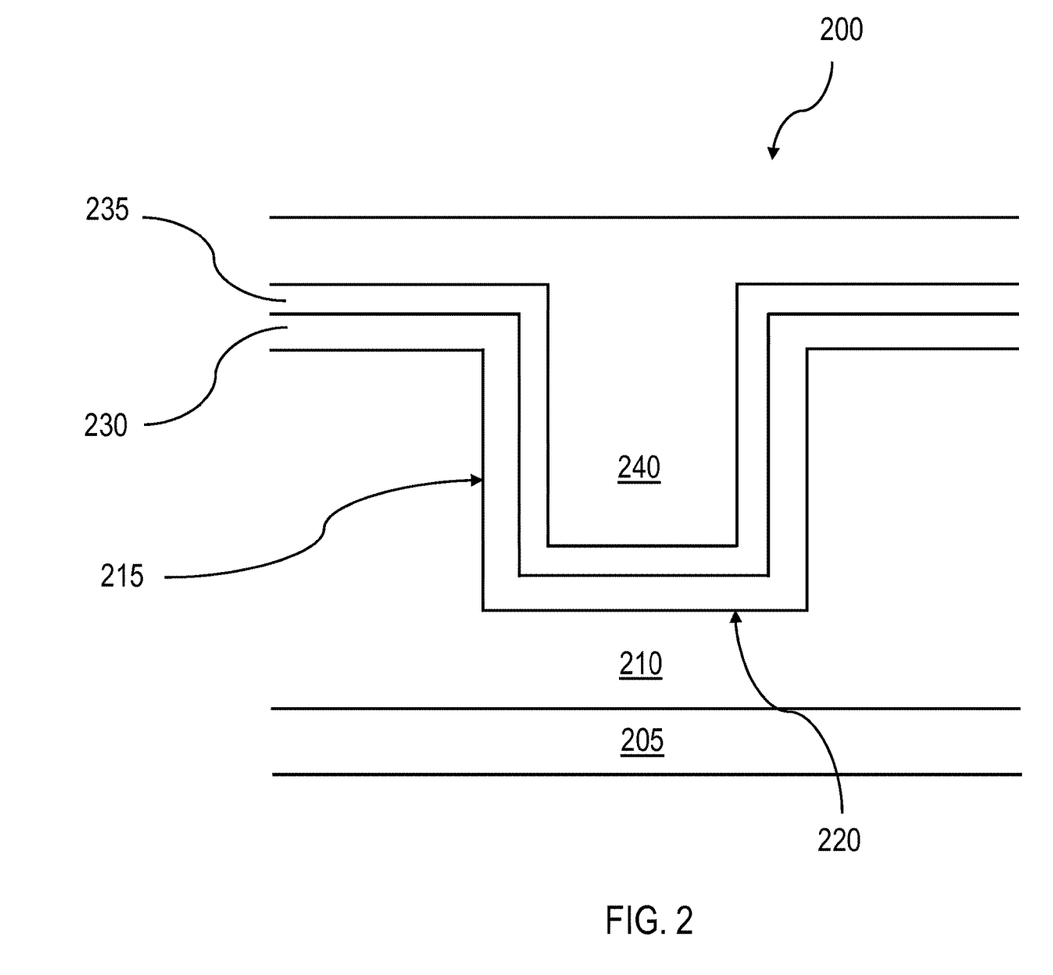
FIG. 2 illustrates a dielectric layer having a first layer, a second layer, and conductive fill material in accordance with one or more embodiments of the invention.

FIG. 2 illustrates a microelectronic device 200 with a substrate 205 and a dielectric layer 210. The dielectric layer 210 has sidewalls 215 and trench bottom 220, which are at least partially covered by a first layer 230. The first layer 230 may be a barrier layer comprising TaN and one or more dopants such as Ru, Cu, Co, Mn, Al, Mg, Nb, Ti or V. In some embodiments, the first layer comprises TaN and Mn. In other embodiments, the first layer comprises TaN and one or more of Ru, Cu and Co.

A second layer 235 is disposed upon the first layer 230, and may comprise one or more of Ru and Co. The second layer may further comprise one or more dopants such as Mn, Al, Mg, Cr, Nb, Ti or V. In some embodiments, the second layer comprises Ru and Mn. In other embodiments, the second layer comprises Co and Mn.

A conductive fill material 240 is deposited in the remainder of the trench defined by sidewall 215 and trench bottom 220. According to one or more embodiments, the conductive fill material comprises copper or a copper alloy. In further embodiments, the conductive fill material also comprises Mn. The conductive material 240 may be deposited directly on the second layer 235, or may be deposited on a seeding layer (not shown) on top of the second layer 235. According to one or more embodiments, the seeding layer comprises an alloy of copper, such as a Cu—Mn alloy. In certain embodiments, the seeding layer comprises less than 2% Mn. In some embodiments, the seeding layer comprises about 1% Mn.

In addition to the films described above, another aspect of the invention relates to a method for forming interconnections in a microelectronic device comprising providing a substrate with a dielectric layer disposed thereon, depositing a barrier layer upon the dielectric layer, and depositing a conductive material upon the barrier layer. According to one or more embodiments of this aspect, the barrier layer comprises TaN and a dopant selected from Ru, Cu, Co, Mn, Al, Mg, Cr, Nb, Ti and V. In some embodiments, the dopant is Mn. In other embodiments, the dopant comprises one or more of Ru, Cu and Co.

The doped TaN layer may be formed by any appropriate deposition process. For example, the TaN can be deposited by an alternating layer deposition (ALD) process or a plasma enhanced atomic layer deposition (PEALD). The dopant can then be deposited by chemical vapor deposition (CVD), physical vapor deposition (PVD) or ALD. The dopant is then diffused into TaN layer to form an integrated TaN dopant layer. The dopant may be diffused into the TaN layer through various processes, including by plasma treatment and by heating.

Alternatively, the TaN and the dopant can be deposited in alternating layers. In accordance with this embodiment, a first TaN layer, such as a TaN monolayer, is deposited on the dielectric film. A first dopant layer, such as a layer of dopant, dopant alloy or other dopant-containing compound, is then deposited on top of the first TaN. This first dopant layer can also be a monolayer. A second TaN layer is then deposited on top of the first dopant layer. This process is repeated until a doped TaN film of the desired thickness is produced.

Notably, certain embodiments of these processes will result in a film with dopant interspersed throughout the entire TaN layer, instead of a separate barrier layer such as Mn on top of the TaN barrier layer. As the dopant is already present in the TaN layer, it may be easier for the dopant to diffuse to the dielectric layer to form the dopant-barrier layer complex, such as $MnSiO_x$. In contrast, if the dopant is only present as a separate barrier layer on top the TaN layer, the dopant must diffuse through the entire thickness of the TaN layer before reaching the dielectric layer.

Suitable precursors for depositing a TaN film include Ta-containing precursors and N-containing precursors. For example, the Ta-containing precursor may be pentakis(dimethylamino)tantalum (PDMAT) and the N-containing precursor may be ammonia. Other suitable precursors are known to those skilled in the art. Organic species in organic-containing precursors for TaN may get partially incorporated into the dielectric layer, which may increase the adhesion at the TaN-dielectric layer interface.

For depositing the dopant metal, an appropriate metal-containing precursor may be used. Examples of suitable precursors include metal complexes containing the desired dopant, such as dopant metals coordinated with organic or carbonyl ligands. A suitable dopant precursor should have sufficient vapor pressure to be deposited in the appropriate process, such as ALD, CVD and PVD. Depending on the dopant precursor used, a co-reactant may be used to deposit the dopant. For example, reducing gases such as hydrogen and ammonia can be used as co-reactants for depositing some dopants.

Certain embodiments of the invention provide that the doped TaN film is treated with a plasma prior to depositing the conductive material. According to one or more embodiments, the plasma comprises one or more of He, Ar, $NH_3$, $H_2$ and $N_2$. In some embodiments, the plasma may comprise a mixture of Ar and $H_2$, such as a mixture having a Ar:$H_2$ molar ratio in the range from 1:1 to 1:10. The plasma power may be in the range from about 400 to about 1000 Watts. The plasma treatment time may vary from 5 second to 60 seconds, such as in the range from 10 seconds to 30 seconds. In some embodiments, the pressure during plasma treatment may be in the range from 0.5 to 50 Ton, such as from 1 to 10 Ton. Alternatively, in some embodiments the barrier layer is not doped TaN. In these embodiments, the barrier layer may comprise $MnN_x$ or TaN that is subsequently exposed to a plasma treatment as described herein.

The conductive material may be deposited in a variety of ways, including by an electroless deposition process, an electroplating (ECP) process, a CVD process or a PVD process. In certain embodiments, a first seed layer is deposited upon the barrier layer, and a bulk conductive layer is then formed upon the seed layer.

Another aspect of the invention pertains to a method for forming interconnections in a microelectronic device comprising providing a substrate with a dielectric layer disposed thereon, depositing a first layer upon the dielectric layer, depositing a second layer upon the first layer, and depositing a conductive material upon the second layer. In embodiments of this aspect, the first layer may comprise TaN and one or more dopants selected from Ru, Cu, Co, Mn, Al, Mg, Cr, Nb, Ti and V. In some embodiments, the first layer comprises TaN and Mn. In other embodiments, the first layer comprises TaN and one or more of Ru, Cu and Co. The doped TaN layer may be formed by any appropriate deposition process, such as those described above.

According to one or more embodiments, the second layer comprises one or more of Ru and Co. In certain embodiments, the second layer further comprises one or more dopants selected from Mn, Al, Mg, Cr, Nb, Ti and V. In some embodiments, the second layer comprises Ru and Mn. In other embodiments, the second layer comprises Co and Mn.

The second layer may be deposited by any appropriate deposition process, including CVD, PVD, ALD, and PEALD. In embodiments where the second layer comprises cobalt, suitable precursors for the second layer include, but are not limited to, cobalt carbonyl complexes, cobalt amidinates compounds, cobaltocene compounds, cobalt dienyl complexes, cobalt nitrosyl complexes, and derivatives and combinations thereof. In embodiments where the second layer comprises ruthenium, suitable precursors include, but are not limited to, pyrrolyl ruthenium precursors such as a pentadienyl pyrrolyl ruthenium precursor, a cyclopentadienyl pyrrolyl ruthenium precursor, an alkylpentadienyl pyrrolyl ruthenium precursor or an alkylcyclopentadienyl pyrrolyl ruthenium precursor.

As with the doping of TaN films, the second layer may be doped by depositing a layer comprising one or more of Ru and Co, and then diffusing a dopant into the Ru and/or Co layer. Alternatively, the Ru and/or Co and the dopant may be deposited in alternating layers until a film of the desired thickness is formed.

Additionally, the conductive material may be desposited in any appropriate process, including those described above. The doped TaN may be treated with a plasma prior to depositing the conductive material, such as a plasma comprising one or more of He, Ar, $NH_3$, $H_2$ and $N_2$ The films in accordance with various embodiments of this invention can be deposited over virtually any substrate material. A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

As embodiments of the invention provide a method for depositing or forming doped TaN films, a processing chamber is configured to expose the substrate to a sequence of gases and/or plasmas during the vapor deposition process. The processing chamber would include separate supplies of reactants, along with any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a deposition process as described herein. The central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

The co-reactants are typically in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

In another embodiment, a doped TaN film may be formed during plasma enhanced atomic layer deposition (PEALD) process that provides sequential pulses of precursors and plasma. In specific embodiments, the co-reactant may involve a plasma. In other embodiments involving the use of plasma, during the plasma step the reagents are generally ionized during the process, though this might occur only upstream of the deposition chamber such that ions or other energetic or light emitting species are not in direct contact with the depositing film, this configuration often termed a remote plasma. Thus in this type of PEALD process, the plasma is generated external from the processing chamber, such as by a remote plasma generator system. During PEALD processes, a plasma may be generated from a microwave (MW) frequency generator or a radio frequency (RF) generator. Although plasmas may be used during the deposition processes disclosed herein, it should be noted that plasmas are not required. Indeed, other embodiments relate to deposition processes under very mild conditions without a plasma.

Another aspect of the invention pertains to an apparatus for deposition of a film on a substrate to perform a process according to any of the embodiments described above. In one embodiment, the apparatus comprises a deposition chamber for deposition of a film on a substrate. The chamber comprises a process area for supporting a substrate. The apparatus includes a precursor inlet in fluid communication with a supply of a Ta precursor, such as pentakis(dimethylamino)tantalum (PDMAT). The apparatus also includes a reactant gas inlet in fluid communication with a supply of nitrogen-containing precursor, such as ammonia. The apparatus also includes a reactant gas inlet in fluid communication with a supply of dopant precursor, such as a dopant-containing metal complex. The apparatus further includes a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat.

In some embodiments, a plasma system and processing chambers or systems which may be used during methods described here for depositing or forming the films can be performed on either PRODUCER®, CENTURA®, or ENDURA® systems, all available from Applied Materials, Inc., located in Santa Clara, Calif. A detailed description of an ALD processing chamber may be found in commonly assigned U.S. Pat. Nos. 6,878,206, 6,916,398, and 7,780,785.

EXAMPLES

A biased thermal stress (BTS) test was performed on various barrier films. The compositions of each film are shown in Table 1 below:

TABLE 1

Barrier Film Compositions

| Film No. | Composition | Deposition Process | Thickness |
|---|---|---|---|
| 1 | $MnN_x$ | Thermal ALD | 10 Angstroms |
| 2 | $MnN_x$ | Thermal ALD | 15 Angstroms |
| 3 | $MnN_x$ | Thermal ALD with plasma post-treatment | 10 Angstroms |
| 4 | Mn-doped TaN | Thermal ALD | 10 Angstroms |
| 5 | Mn-doped TaN | Thermal ALD with plasma post-treatment | 10 Angstroms |
| 6 | TaN | Thermal ALD with plasma post-treatment | 10 Angstroms |
| 7 | TaN | Thermal ALD with plasma post-treatment | 15 Angstroms |
| 8 | Ta | Thermal ALD | 30 Angstroms |
| 9 | TaN | PEALD | 20 Angstroms |

The films subjected to a plasma post-treatment were exposed to a plasma containing an $Ar:H_2$ mixture of 1:1 to 1:10 for 10 to 30 seconds. The plasma power was 400 to 1000 W and the pressure was 1 to 10 Tort The Mn-doped TaN films contained about 10 A of TaN and about 1 A of Mn. The TaN films were exposed to Mn precursor doping for 1 to 5 s and optionally had a $NH_3$ soak for 5 to 30 s.

Figure 3:
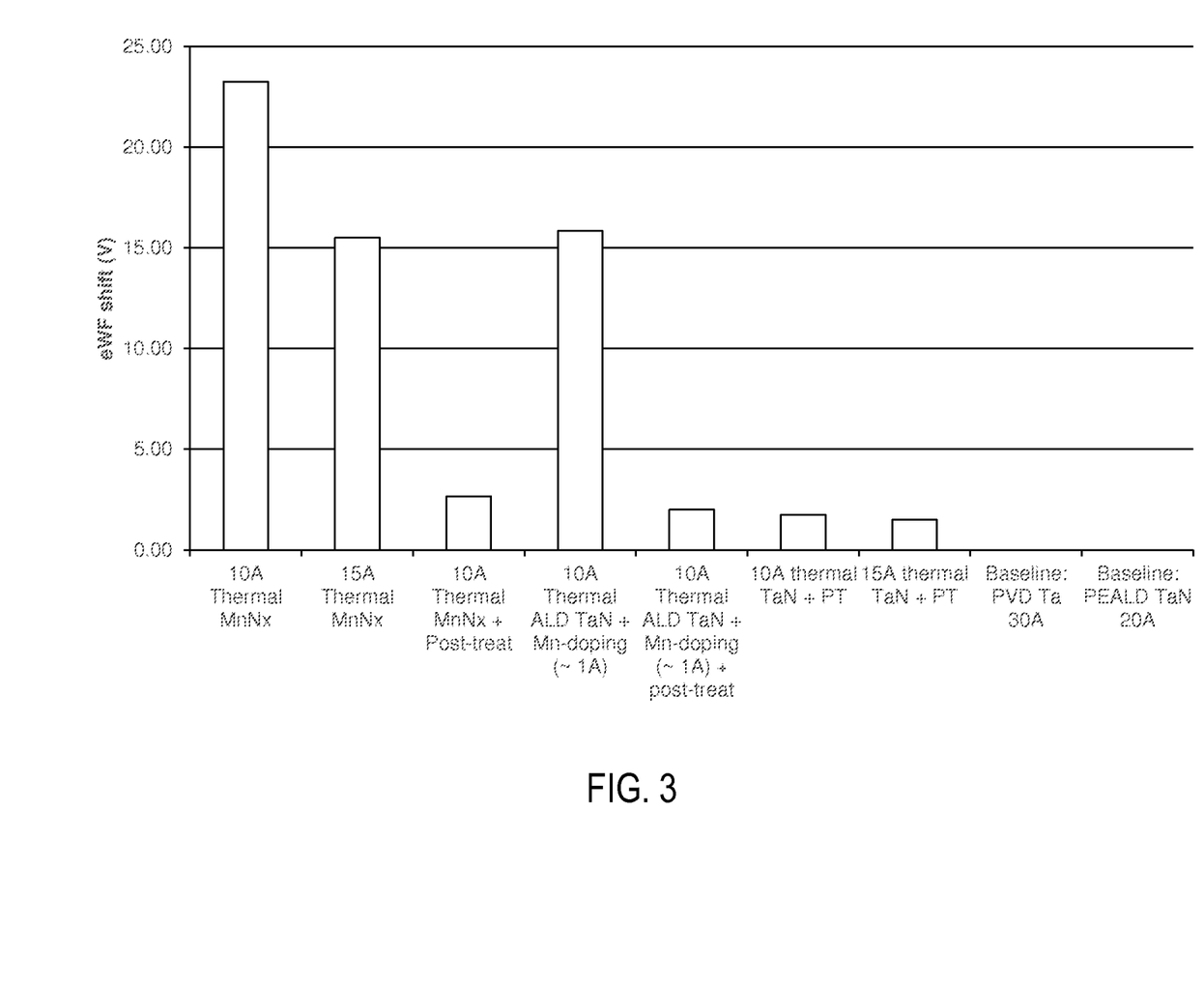
FIG. 3 shows the results from a biased thermal stress test of various barrier films.

The results of the BTS test are shown in FIG. 3. Films 8 and 9 were the baseline with an eWF shift of 0V. A lower eWF shift in FIG. 3 demonstrates that a barrier film had better barrier properties. As can be seen from FIG. 3, film 4 (corresponding to 10 A Mn-doped TaN) exhibited superior barrier properties compared to film 1 (10 A $MnN_x$) and had comparable barrier properties to a $MnN_x$ film with a larger thickness (film 2). The plasma post-treatment enhanced the barrier properties of all films.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method for forming interconnections in a microelectronic device comprising:
providing a substrate comprising a dielectric layer disposed thereon, the dielectric layer having one or more trenches and/or vias with an opening, a sidewall and a bottom;
depositing a discrete barrier layer on at least a portion of the sidewall and/or bottom of the trench and/or via to provide a lined trench and/or via, the discrete barrier layer comprising TaN and 0.1 to 10%, one or more dopant selected from Ru, Cu, Co, Mn, Al, Mg, Cr, Nb, Ti, or V, based on the weight of the TaN layer, wherein depositing the discrete barrier layer comprises depositing alternating layers comprising a layer of TaN and a layer of the dopant, the layer of TaN less than 10 Å; and
depositing a conductive material comprising Cu into the lined trench and/or via.

2. The method of claim 1, wherein the conductive material further comprises Mn.

3. The method of claim 1, wherein the dopant comprises Mn.

4. The method of claim 1, wherein the dopant comprises one or more of Ru, Cu or Co.

5. The method of claim 1, further comprising exposing the discrete barrier layer to plasma treatment prior to depositing the conductive material comprising Cu.

6. The method of claim 5, wherein the plasma comprises one or more of He, Ar, $NH_3$, $H_2$, or $N_2$.

7. A method for forming interconnections in a microelectronic device comprising:
providing a substrate comprising a dielectric layer disposed thereon, the dielectric layer having one or more trenches and/or vias with an opening, a sidewall and a bottom;
depositing a first discrete layer on at least a portion of the sidewall and/or bottom of the trench and/or via to provide a lined trench and/or via, the first discrete layer comprising TaN and 0.1 to 10% a first dopant selected from one or more of Ru, Cu, Co, Mn, Al, Mg, Cr, Nb, Ti, or V, based on the weight of the TaN layer, wherein depositing the first discrete layer comprises depositing alternating layers comprising a layer of TaN and a layer of the first dopant, the layer of TaN less than 10 Å;
depositing a second layer comprising one or more of Ru or Co upon the first discrete layer; and
depositing a conductive material comprising Cu into the lined trench and/or via.

8. The method of claim 7, wherein the conductive material further comprises Mn.

9. The method of claim 8, wherein the conductive material comprises less than 2 wt. % Mn.

10. The method of claim 7, wherein the first dopant comprises Mn.

11. The method of claim 7, wherein the second layer further comprises one or more second dopants selected from Mn, Al, Mg, Cr, Nb, Ti, or V.

12. The method of claim 11, wherein the second layer is deposited by depositing alternating layers comprising Ru or Co and the second dopant.

13. The method of claim 7, further comprising exposing the first discrete layer to plasma treatment prior to depositing the conductive material.

14. The method of claim 13, wherein the plasma comprises one or more of He, Ar, $NH_3$, $H_2$, or $N_2$.

15. The method of claim 7, wherein the dopant comprises one or more of Ru, Cu or Co.

16. The method of claim 7, wherein the layer of TaN is in the range of 4 Å to less than 10 Å.

17. A microelectronic device comprising:
- a substrate comprising a dielectric layer disposed thereon, the dielectric layer having one or more trenches and/or vias with an opening, a sidewall and a bottom;
- a first discrete layer lining at least a portion of the sidewall and/or bottom of the trench and/or via, the first discrete layer comprising TaN and 0.1 to 10% a first dopant selected from one or more of Ru, Cu, Co, Mn, Al, Mg, Cr, Nb, Ti or V, based on the weight of the TaN layer, wherein the first discrete layer comprises alternating layers comprising a layer of TaN and a layer of the first dopant, the layer of TaN less than 10 Å;
- a second layer comprising one or more of Ru or Co overlying the first discrete layer; and
- a conductive material comprising Cu filling the lined trench and/or via.

18. The microelectronic device of claim 17, wherein the conductive material further comprises Mn.

19. The microelectronic device of claim, 18, wherein the conductive material comprises less than 2 wt. % Mn.

20. The microelectronic device of claim 17, wherein the second layer further comprises one or more second dopants selected from Mn, Al, Mg, Cr, Nb, Ti, or V.

21. The microelectronic device of claim 17, wherein the dopant comprises one or more of Ru, Cu or Co.

22. The microelectronic device of claim 17, wherein the layer of TaN is in the range of 4 Å to less than 10 Å.

* * * * *

UNITED STATES PATENT AND TRADEMARK OFFICE
CERTIFICATE OF CORRECTION

PATENT NO. : 10,784,157 B2
APPLICATION NO. : 13/689871
DATED : September 22, 2020
INVENTOR(S) : Annamalai Lakshmanan et al.

Page 1 of 1

It is certified that error appears in the above-identified patent and that said Letters Patent is hereby corrected as shown below:

In the Specification

In Column 1, Line 10, insert --.-- after "its entirety"

In Column 7, Line 17, replace "desposited" with "deposited"

In Column 7, Line 21, insert --.-- after "NH3, H2 and N2"

In Column 9, Line 34, replace "10 Tort" with "10 Torr."

Signed and Sealed this
Third Day of November, 2020

Andrei Iancu
*Director of the United States Patent and Trademark Office*